(12) United States Patent
Omaru

(10) Patent No.: US 7,830,196 B2
(45) Date of Patent: Nov. 9, 2010

(54) SEMICONDUCTOR DEVICE ALLEVIATING OR PREVENTING SURGE VOLTAGE

(75) Inventor: Takeshi Omaru, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 960 days.

(21) Appl. No.: 11/626,566

(22) Filed: Jan. 24, 2007

(65) Prior Publication Data
US 2008/0074816 A1 Mar. 27, 2008

(30) Foreign Application Priority Data
Sep. 25, 2006 (JP) ............................. 2006-258329

(51) Int. Cl.
*H03K 5/08* (2006.01)
(52) U.S. Cl. ........................ 327/309; 327/312; 327/319; 327/324
(58) Field of Classification Search ................. 327/309, 327/310, 312, 318–320, 324
See application file for complete search history.

(56) References Cited

U.S. PATENT DOCUMENTS

| | | | | |
|---|---|---|---|---|
| 4,366,522 | A | * | 12/1982 | Baker .......................... 361/91.7 |
| 5,666,280 | A | * | 9/1997 | Janaswamy et al. ............ 363/98 |
| 6,268,990 | B1 | * | 7/2001 | Ogura et al. ................. 361/91.7 |
| 7,176,743 | B2 | * | 2/2007 | Leonowich et al. .......... 327/423 |
| 7,212,063 | B2 | * | 5/2007 | Munzer et al. ............... 327/419 |
| 7,319,579 | B2 | * | 1/2008 | Inoue et al. .................. 361/118 |

FOREIGN PATENT DOCUMENTS

| | | | |
|---|---|---|---|
| CN | 1089965 C | | 8/2002 |
| JP | 62-43916 | * | 2/1987 |
| JP | 1-280355 | | 11/1989 |
| JP | 4-354156 | | 12/1992 |
| JP | 7-288456 | | 10/1995 |
| JP | 2000-92817 | * | 3/2000 |
| JP | 2000-324797 | | 11/2000 |
| JP | 2001-238348 | * | 8/2001 |
| JP | 2002-135973 | | 5/2002 |
| JP | 2005-295653 | | 10/2005 |
| JP | 2006-42410 | | 2/2006 |

\* cited by examiner

*Primary Examiner*—Kenneth B. Wells
(74) *Attorney, Agent, or Firm*—Oblon, Spivak, McClelland, Maier & Neustadt, L.L.P.

(57) ABSTRACT

When an insulated gate bipolar transistor turned on starts to transition to turn off, the insulated gate bipolar transistor has between the emitter and the collector a surge voltage caused in proportion to the magnitude of a current gradient provided when a current flowing through a coil in switching is interrupted and an electrode interconnect inductance internal to an inverter circuit. A MOS transistor is temporarily turned on within a period of time for which the insulated gate bipolar transistor turned on transitions to turn off. This can bypass a portion of the current to the MOS transistor. This can provide an alleviated apparent current gradient of the current and thus alleviate or prevent a surge voltage caused at the insulated gate bipolar transistor.

4 Claims, 4 Drawing Sheets

SEMICONDUCTOR DEVICE ALLEVIATING OR PREVENTING SURGE VOLTAGE

BACKGROUND OF THE INVENTION

1. Field of the Invention

The present invention relates to protecting power semiconductor element from overvoltage.

2. Description of the Background Art

To effectively utilize electrical power energy, a power conversion device that employs a power semiconductor element is generally used and for example, a power electronics device including a power conversion device for driving a motor includes an inverter device and the like.

This inverter device has a power semiconductor element therein, and in recent years, this semiconductor element is generally implemented by an insulated gate bipolar transistors (IGBT).

This power semiconductor element, or IGBT, is used in a method as a switching element to switch a current rapidly to control higher voltage and larger current. For such devices as the inverter device, when the semiconductor element switches, a current has a significant variation, which will hereinafter be represented in degree as a current gradient dI/dt, and a large surge voltage attributed to a floating inductance of a circuit will be applied to the semiconductor element.

If this surge voltage causes a current/voltage locus in switching to exceed the safe operation area (SOA) of the semiconductor element, the element is destroyed.

Accordingly, a variety of systems that alleviate or prevent such destruction of an element that is caused by surge voltage have conventionally been proposed, for example, as described in Japanese Patent Laying-open Nos. 04-354156, 2000-324797, 01-280355, 07-288456, 2002-135973, 2005-295653 and 2006-042410.

As has been described above, a surge voltage increases depending on current gradient dI/dt provided when the semiconductor element switches. Accordingly, if a current is interrupted slowly, the surge voltage can be reduced. This, however, is tradeoff with increased switching loss.

SUMMARY OF THE INVENTION

The present invention has been made to overcome the above disadvantage and it contemplates a semiconductor device capable of alleviating or preventing such destruction of an element that is attributed to excessively large surge voltage, and switching loss.

In accordance with the present invention a semiconductor device includes: a half bridge circuit including a first semiconductor switching element disposed between a first voltage and an output node and driven in response to a first control signal received, and a second semiconductor switching element connected between the output node and a second voltage lower than the first voltage to the first switching element in series and driven in response to a second control signal received; and a first MOS transistor associated with the first semiconductor switching element, and connected to the first semiconductor switching element in parallel and receiving a third control signal to turn on/off. The first MOS transistor is temporarily turned on in response to the third control signal for a period of time during which the first semiconductor switching element switches from the on state to the off state in response to the first control signal.

In the present semiconductor device, while the first semiconductor switching element switches from the on state to the off state in response to the first control signal, a first MOS transistor can temporarily be turned on to bypass to the first MOS transistor a current passing through the first semiconductor switching element. This can provide an alleviated current gradient of the current passing through the first semiconductor switching element and thus alleviate or prevent surge voltage.

In accordance with the present invention another semiconductor device includes: a half bridge circuit including a first semiconductor switching element disposed between a first voltage and an output node and driven in response to a first control signal received, and a second semiconductor switching element connected between the output node and a second voltage lower than the first voltage to the first switching element in series and driven in response to a second control signal received; and a first MOS transistor associated with the second semiconductor switching element, and connected to the second semiconductor switching element in parallel and receiving a third control signal to turn on/off. The first MOS transistor is temporarily turned on in response to the third control signal for a period of time during which the first semiconductor switching element switches from the off state to the on state in response to the first control signal.

In the present semiconductor device, while the first semiconductor switching element switches from the off state to the on state in response to the first control signal, a first MOS transistor can temporarily be turned on to bypass to the first MOS transistor a recovery current caused depending on a current passing when the first semiconductor switching element turns on. This can provide an alleviated current gradient of the recovery current and thus alleviate or prevent surge voltage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram for illustrating alleviating or preventing a surge voltage caused when an insulated gate bipolar transistor turned off turns on.

DESCRIPTION OF THE PREFERRED EMBODIMENTS

Hereinafter embodiments of the present invention will more specifically be described with reference to the drawings.

In the figures, identical or corresponding components are identically denoted and will not be described repeatedly.

First Embodiment

In the present embodiment will be described a system alleviating or preventing a surge voltage for a half bridge circuit converting a direct current to an alternate current as one example of an inverter device 1 in accordance with a first embodiment of the present invention.

Figure 1:
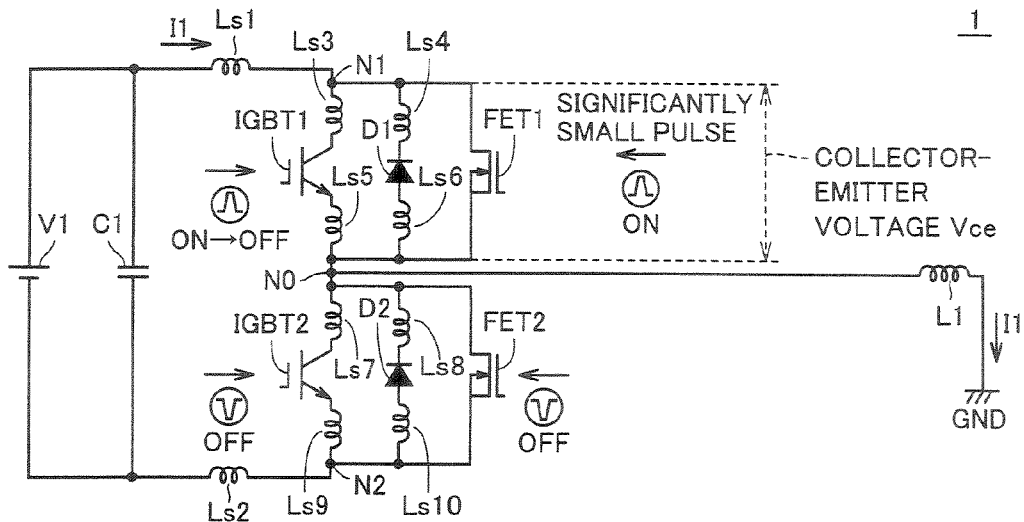
FIG. 1 shows a configuration of a circuit of an inverter device in a first embodiment of the present invention.

With reference to FIG. 1, the half bridge circuit includes insulated gate bipolar transistors IGBTs 1 and 2 connected in series to a power supply V1 to supply a current I1 to a load of a coil L1 connected to a node N0. A Capacitor C1 is power supply capacitance. Insulated gate bipolar transistor IGBT1 has a collector connected via an electrode interconnect inductance Ls3 to power supply V1 at a positive node N1, and an emitter connected via an electrode interconnect inductance Ls5 to node N0. Insulated gate bipolar transistor IGBT2 has a collector connected via an electrode interconnect inductance Ls7 to node N0 and an emitter connected via an electrode interconnect inductance Ls9 to power supply V1 at a negative node N2.

Furthermore, corresponding to insulated gate bipolar transistor IGBT1, there are provided, each in parallel therewith, a diode D1 and a MOS transistor FET1 (also referred to as an upper arm). More specifically, diode D1 has a cathode side connected via an electrode interconnect inductance Ls4 to node N1, and an anode side connected via an electrode interconnect inductance Ls6 to node N0. MOS transistor FET1 is provided between nodes N1 and N0 in parallel with diode D1 and has a gate receiving a pulse signal as described hereinafter. Furthermore, corresponding to insulated gate bipolar transistor IGBT2, there are provided, each in parallel therewith, a diode D2 and a MOS transistor FET2 (also referred to as a lower arm). More specifically, diode D2 has a cathode side connected via an electrode interconnect inductance Ls8 to node N0, and an anode side connected via an electrode interconnect inductance Ls10 to node N2. MOS transistor FET2 is provided between nodes N0 and N2 in parallel with diode D2 and has a gate receiving a pulse signal as described hereinafter.

Electrode interconnect inductance Ls1 is provided between power supply V1 and node N1. Electrode interconnect inductance Ls2 is provided between a ground voltage GND and node N2.

Note that electrode interconnect inductances Ls1 and Ls2 are larger in value than electrode interconnect inductances Ls3-Ls10. In the present embodiment for example the sum of electrode interconnect inductances Ls1 and Ls2 is set to have a value in inductance of approximately a total of electrode interconnect inductances Ls3-Ls10 for the sake of illustration.

Insulated gate bipolar transistor IGBT1 is controlled by a switching operation to supply a desired current to a load, or coil L1. The switching operation is a typical technique, and will not be described herein.

Figure 2:
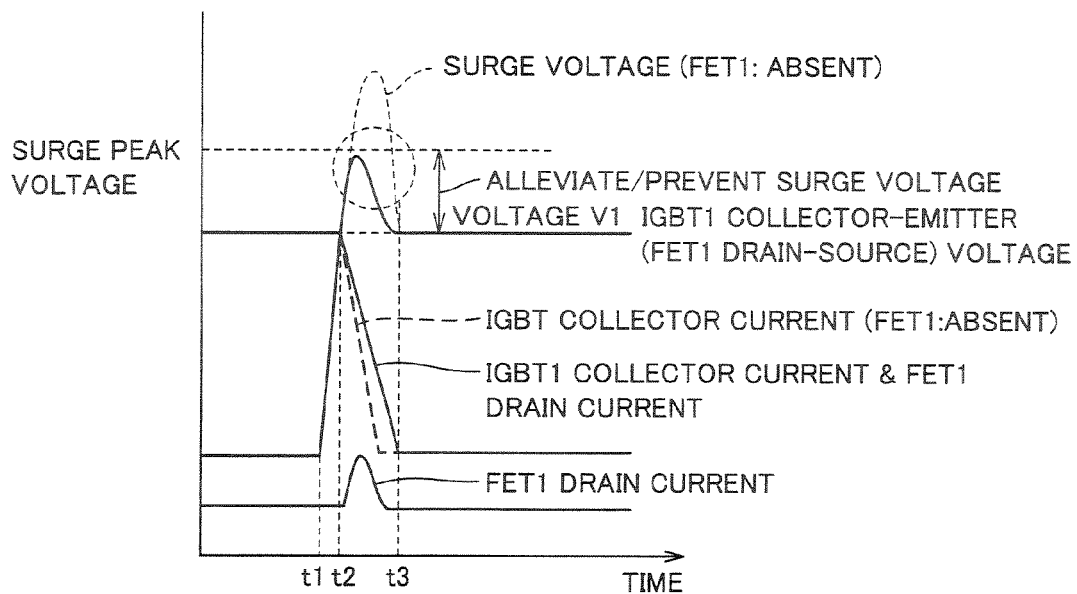
FIG. 2 is a diagram for illustrating alleviating or preventing a surge voltage caused when an insulated gate bipolar transistor turned on turns off.

FIG. 2 is a diagram for illustrating alleviating or preventing a surge voltage caused when insulated gate bipolar transistor IGBT1 turned on turns off.

With reference to FIG. 2 at time t1 the insulated gate bipolar transistor turned on starts to transition to turn off. More specifically insulated gate bipolar transistor IGBT1 is set turned off and has a voltage V1 set between the collector and emitter, when insulated gate bipolar transistor IGBT1 has between the collector and emitter a surge voltage caused in proportion to current gradient dI/dt provided in interrupting current I1 flowing through coil L1 in switching, and electrode interconnect inductance internal to the inverter circuit. In the present embodiment a surge voltage is caused at time t2, exceeding voltage V1. Note that a surge voltage indicates a voltage between voltage V1 and a surge peak voltage for the sake of illustration.

In the present embodiment MOS transistor FET1 is temporally turned on within a period of time for which insulated gate bipolar transistor IGBT1 transitions to turn off (This period of time will also be referred to as "the off time".) For example MOS transistor FET1 can temporarily be turned on by applying a significantly small pulse to MOS transistor FET1 at the gate. Note that the period of time for which insulated gate bipolar transistor IGBT1 turned on transitions to turn off is set to be a period of time starting when current I1 flowing through insulated gate bipolar transistor IGBT1 starts to decrease and ending when the current converges substantially to 0 (i.e., time t2 to time t3). As one example, insulated gate bipolar transistor IGBT1 can transition for a period of time of 0.2 µs to 3 µs to turn off. Furthermore, as one example, the significantly small pulse may pulse for a period of time set to be 50% of the off time of insulated gate bipolar transistor IGBT1, i.e., 0.1 µs to 1.5 µs.

Temporarily turning on MOS transistor FET1 within the off time (i.e., time t2 to time t3) of insulated gate bipolar transistor IGBT1 allows a portion of current I1 to be bypassed to MOSFET1. This can provide an alleviated apparent current gradient dI/dt of current I1 and accordingly alleviate or prevent a surge voltage caused at insulated gate bipolar transistor IGBT1. In FIG. 2 is shown an example in which as there is caused a drain current flowing through MOS transistor FET1, insulated gate bipolar transistor IGBT1 and MOS transistor FET1 pass a current dropping with a gradient alleviated as compared with that of a collector current of insulated gate bipolar transistor IGBT1 dropping with MOS transistor FET1 absent. More specifically the presence of MOS transistor FET1 allows current gradient dI/dt to be smaller than the absence thereof does.

A configuration with MOS transistors FET1 and FET2 absent, as conventional, has a possibility of an insufficiently alleviated or prevented surge voltage and hence a destroyed element. The present system can sufficiently alleviate or prevent surge voltage.

Furthermore, insulated gate bipolar transistor IGBT1 per se operates as conventional. It is cut off as normal, and thus switches without a substantially increased loss. Although MOS transistor FET1 will receive high voltage, the significantly small pulse only turns on MOS transistor FET1 for a significantly short period of time. This allows current I1 to be bypassed by passing a small amount thereof, and MOS transistor FET1 per se to switch with a minimized loss.

Furthermore, MOS transistors FETs 1 and 2 can be designed to withstand high voltage and pass a small current to further allow MOS transistor FET1 per se to switch with a minimized loss. For example a design can be made to drive for MOS transistors FETs 1 and 2 a current of 1/10 of that for insulated gate bipolar transistor IGBT1. This allows MOS transistors FETs 1 and 2 to be reduced in size and a circuit to be miniaturized.

Note that MOS transistor FET1 is a unipolar element, and thus not affected by a lifetime of a residual carrier. As such, when it is compared with insulated gate bipolar transistor IGBT1 implemented by a bipolar element, the former is advantageously excellent in controllability in switching. If MOS transistor FET1 turned on has a large current passing therethrough, there is a possibility that it may have a larger switching loss than insulated gate bipolar transistor IGBT1 does. In reality, however, MOS transistor FET1 only passes a small current. As such, its switching loss is substantially negligible.

First Embodiment in Exemplary Variation

Figure 3:
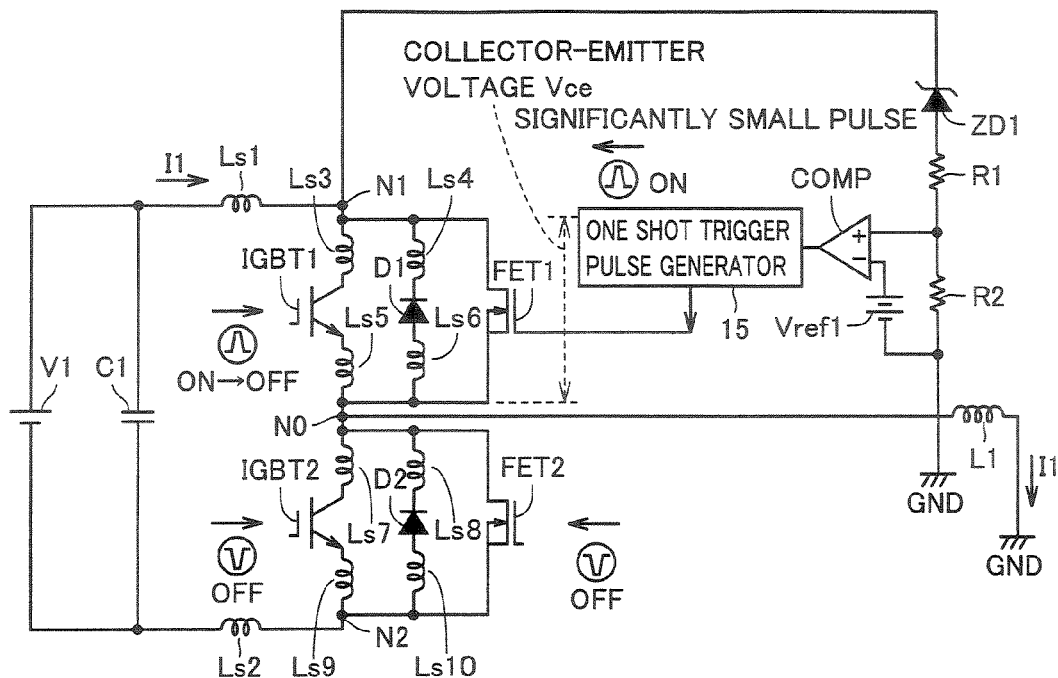
FIG. 3 shows a configuration of a circuit of an inverter device in an exemplary variation of the first embodiment of the present invention.

With reference to FIG. 3, the present invention in the first embodiment in an exemplary variation provides an inverter device 10, which differs from inverter device 1 in that the former further includes a signal generation circuit generating a significantly small pulse driving MOS transistor FET1.

More specifically, the former differs from the latter in that the former further includes a one shot trigger pulse generator 15 generating a significantly small pulse applied to MOS transistor FET1 at the gate, a comparator COMP, a zener diode ZD1, and resistance elements R1 and R2.

Zener diode ZD1 has a cathode side electrically coupled with power supply V1 at a positive side, and an anode side electrically coupled via resistance elements R1 and R2 with ground voltage GND.

Resistance elements R1 and R2 are connected in series between zener diode ZD1 and ground voltage GND by a node which is electrically coupled with comparator COMP at one terminal. Comparator COMP has the other terminal receiving a reference voltage Vref1, and compares a voltage generated at the node connecting resistance elements R1 and R2 with reference voltage Vref1 and outputs a result of such comparison to one shot trigger pulse generator 15.

If one shot trigger pulse generator 15 receives the result e.g., a signal having the high level, from comparator COMP, it outputs a one shot pulse signal (a significantly small pulse) to MOS transistor FET1.

The above operation will now be more specifically described.

When the insulated gate bipolar transistor turned on starts to transition to turn off, insulated gate bipolar transistor IGBT1 has a surge voltage caused between the collector and the emitter, as has previously been described above. This surge voltage will exceed the zener voltage of zener diode ZD1 and resistance elements R1 and R2 will receive voltage, and a voltage divided by resistance elements R1 and R2 in accordance with their values in resistance is generated at the node connecting the resistance elements. Comparator COMP compares the voltage thus generated at the node with reference voltage Vref1, and if a voltage of equal to or larger than reference voltage Vref1 is generated at the node, comparator COMP outputs a result of such comparison indicating the high level to one shot trigger pulse generator 15.

One shot trigger pulse generator 15 receives from comparator COMP a signal of the result of such comparison (indicating the "high" level) and outputs a significantly small pulse (having a high level for a period of 0.1 to 1.5 μsec) only once. The pulse is applied to MOS transistor FET1 to temporarily turn on MOS transistor FET1 during the off period of insulated gate bipolar transistor IGBT1 to allow a portion of current I1 to be bypassed to MOS transistor FET1. This operation can alleviate or prevent a surge voltage, as described in the first embodiment.

Note that the significantly small pulse can have a width (or a period of the high level), which is set within the off period of insulated gate bipolar transistor IGBT1 and can be set within an optimal range in accordance with a characteristic of inverter device 10. For example, insulated gate bipolar transistor IGBT1 has the off period set to be approximately 0.2 μsec to 3 μsec.

Generally, surge voltage's tolerance value is set within a rated withstand voltage of an element of interest. Accordingly, setting the zener voltage of zener diode ZD1 to be equal to or larger than the rated withstand voltage of the device of insulated gate bipolar transistor IGBT1 or diode D1 can alleviate or prevent only a surge voltage caused when a large load is involved and a large current is interrupted, so that MOS transistor FET1 can be set to be inoperative when a small load is involved and a small current is interrupted, and a large surge voltage is not caused. This can prevent MOS transistor FET1 from unnecessarily operating and accordingly generating heat, and unnecessarily switching and thus providing an increased loss.

Furthermore one shot trigger pulse generator 15 included in the signal generation circuit provided in accordance with the first embodiment is configured to output a significantly small pulse only once when surge voltage is caused; it does not adopt a system holding MOS transistor FET1 turned on while surge voltage is caused. As such, if an excessively large surge voltage is applied for a long period of time, MOS transistor FET1 is not turned on for the long period of time The transistor can thus be prevented from otherwise generating heat resulting in thermal destruction.

Furthermore the signal generation circuit in accordance with the first embodiment of the present invention adopts a system allowing comparator COMP to compare a voltage divided by resistance elements R1 and R2 in accordance with their values in resistance with reference voltage Vref1 to detect a surge voltage. Accordingly, resistance elements R1 and R2 may be adjusted in resistance or reference voltage Vref1 can be adjusted to slightly adjust a level for detection of surge voltage.

Note that while the above has described a system alleviating or preventing a turn-off surge voltage, i.e., a surge voltage caused when insulated gate bipolar transistor IGBT1 operates to switch when insulated gate bipolar transistor IGBT1 turned on transitions to turn off, it also applies to insulated gate bipolar transistor IGBT2 operating to switch with load L1 connected to power supply V1. A similar system can be applied to also alleviate or prevent a turn-off surge voltage caused when insulated gate bipolar transistor IGBT2 turned on transitions to turn off.

Second Embodiment

While the first embodiment has described a system alleviating or preventing the turn-off surge voltage caused when insulated gate bipolar transistor IGBT1 turned on transitions to turn off, the second embodiment will describe a system alleviating or preventing a turn-on surge voltage, i.e., a surge voltage caused when insulated gate bipolar transistor IGBT1 turned off transitions to turn on.

Figure 4:
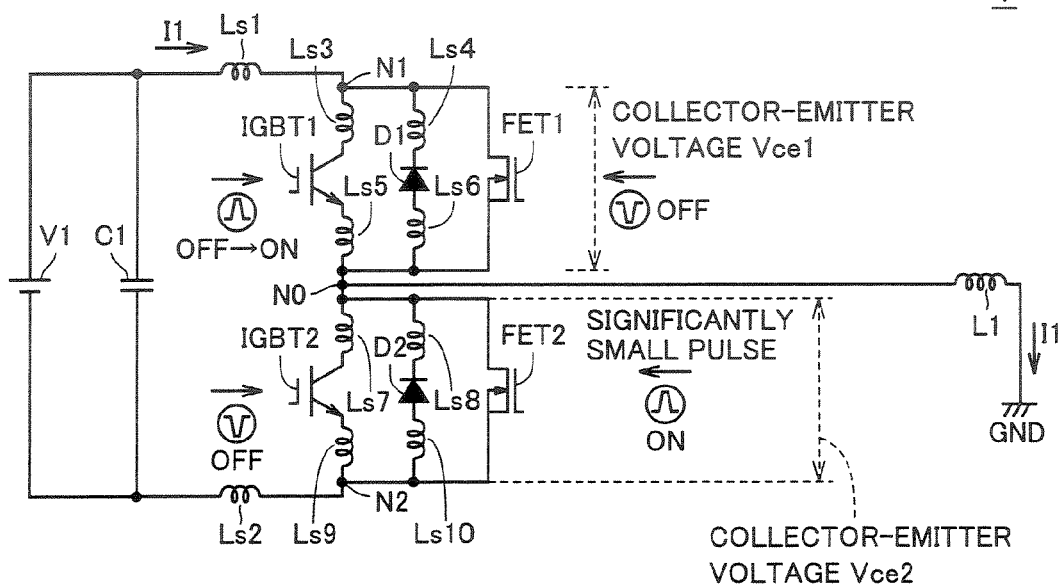
FIG. 4 shows a configuration of a circuit of an inverter device in a second embodiment of the present invention.

With reference to FIG. 4, the present invention in the second embodiment provides an inverter device having a circuit configuration similar to that of inverter device 1 described in the first embodiment.

Initially will be described a surge voltage caused when insulated gate bipolar transistor IGBT1 turned off transitions to turn on.

A half bridge circuit operates to switch to allow current I1 to reflow in a closed circuit of coil L1 serving as a load and a diode D2, or provide the so-called freewheel for the sake of illustration.

When insulated gate bipolar transistor IGBT1 turned off transitions to turn on, a recovery current will flow through diode D2. A surge voltage proportional to gradient dI/dt of recovery current and the magnitude of electrode interconnect inductance internal to the inverter circuit will be caused at insulated gate bipolar transistor IGBT2 between the collector and the emitter or at diode D2 between the anode and the cathode. The voltage at diode D2 between the anode and the cathode or at insulated gate bipolar transistor IGBT1 between the collector and the emitter will be represented as a voltage Vce2.

Accordingly if a surge voltage exceeding the element's withstand voltage is applied there is a possibility that the element may be destroyed, and accordingly, alleviating current gradient dI/dt is considered as an approach. This, however, is tradeoff with increased switching loss.

Figure 5:
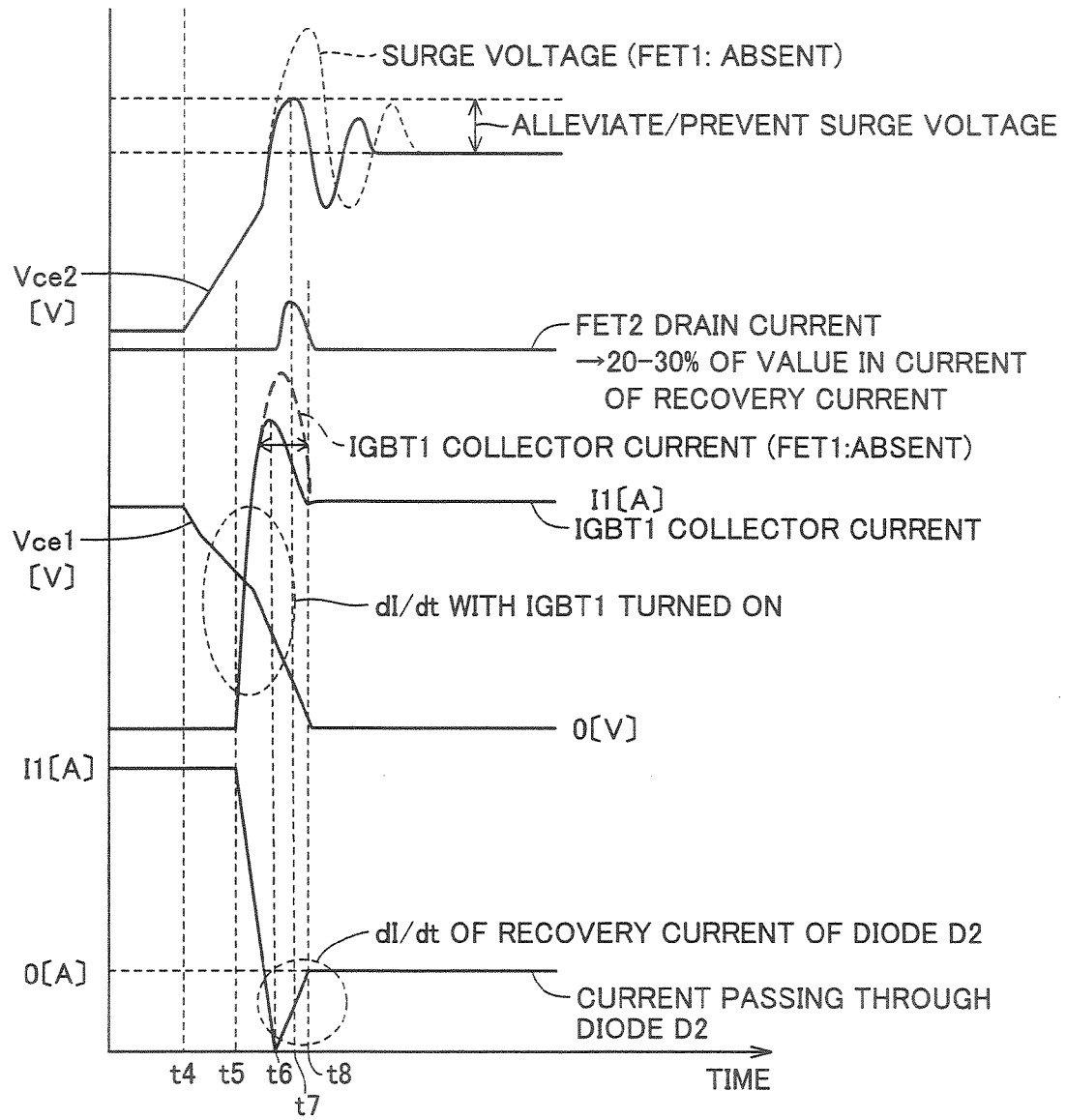

Reference will now be made to FIG. 5 to describe how a surge voltage is alleviated or prevented that is caused when insulated gate bipolar transistor IGBT1 turned off transitions to turn on.

With reference to FIG. 5 herein at time t4 insulated gate bipolar transistor IGBT1 turned off starts to transition to turn on. Herein is shown an example with a voltage of insulated gate bipolar transistor IGBT1 between the collector and the emitter, or voltage Vce1, starting to vary. Furthermore, accordingly, a voltage of insulated gate bipolar transistor IGBT2 between the collector and the emitter, or voltage Vce2, starts to vary.

At time t5 the collector current insulated gate bipolar transistor IGBT1 starts to vary and the current conducting through diode D2 starts to vary. At time t6 the collector current of insulated gate bipolar transistor IGBT1 reaches a maximum. Accordingly, the recovery current of diode D2 flowing backward reaches a maximum. The recovery current has current gradient dI/dt proportional to that of a current conducting when insulated gate bipolar transistor IGBT1 is turned on. FIG. 5 shows in areas surround by broken lines a gradient or current gradient dI/dt of a collector current of insulated gate bipolar transistor IGBT1 and that of a recovery current flowing through diode D2. Depending on the recovery current's gradient or current gradient dI/dt, a surge voltage is caused at diode D2 between the anode and the cathode or at insulated gate bipolar transistor IGBT2. In this example is shown an example with a surge voltage peaking in value at time t7. In the system in accordance with the second embodiment MOS transistor FET2 is temporarily turned on within a period of time for which insulated gate bipolar transistor IGBT1 turned off transitions to turn on. (This period of time will herein after also be referred to as "the on time".) For example MOS transistor FET2 can temporarily be turned on by applying a significantly small pulse to MOS transistor FET2 at the gate. Note that the period of time for which insulated gate bipolar transistor IGBT1 turned off transitions to turn on is set to be a period of time starting when current I1 flowing through insulated gate bipolar transistor IGBT1 starts to increase and ending when the value of the current transitions to a constant level, i.e., time t5 to time t8. As one example, insulated gate bipolar transistor IGBT1 turned off can transition for a period of time of 0.2 μsec to 3 μsec to turn on. Furthermore as one example the significantly small pulse may pulse for a period of time of approximately 20% of the off time of insulated gate bipolar transistor IGBT1, i.e., 0.04 μsec to 0.6 μsec.

Temporarily turning on MOS transistor FET2 during a period of time for which insulated gate bipolar transistor IGBT1 turned off transitions to turn on, i.e., time t5 to time t8, allows a portion of a recovery current to be bypassed to MOS transistor FET2. This can alleviate current gradient dI/dt of a collector current of insulated gate bipolar transistor IGBT1 and hence alleviate or prevent a surge voltage applied to diode D2 or insulated gate bipolar transistor IGBT2. Herein is indicated an example with MOS transistor FET2 turned on to allow a current of 20% to 30% of a recovery current to flow as a drain current.

A configuration with MOS transistors FET1 and FET2 absent, as conventional, has a possibility of an insufficiently alleviated or prevented surge voltage and hence a destroyed element. The present system can sufficiently alleviate or prevent surge voltage.

Furthermore, insulated gate bipolar transistor IGBT1 per se operates as conventional. It operates as normal, and thus switches without a substantially increased loss. Although MOS transistor FET2 will receive high voltage, the significantly small pulse only turns on MOS transistor FET2 for a significantly short period of time. This allows the recovery current to be bypassed by passing a small amount thereof, and MOS transistor FET2 per se to switch with a minimized loss. Furthermore, as insulated gate bipolar transistor IGBT1 turns on and MOS transistor FET2 turns on, there is a possibility that the upper and lower arms can establish a short circuit. However, MOS transistor FET2 is only turned on for a significantly small period of time (as the significantly small pulse has the high level for a period of time of 0.04 μsec to 0.6 μsec). The upper and lower arm can thus be prevented from establishing a short circuit, while only a surge voltage alone can be reduced.

Furthermore, MOS transistors FETs 1 and 2 can be designed to withstand high voltage and pass a small current to further allow MOS transistor FET2 per se to switch with a minimized loss. For example a design can be made to drive for MOS transistors FETs 1 and 2 a current of 1/10 of that for insulated gate bipolar transistor IGBT1. This allows MOS transistors FETs 1 and 2 to be reduced in size and a circuit to be miniaturized.

Note that MOS transistor FET2 is a unipolar device, and thus not affected by a lifetime of a residual carrier. As such, when it is compared with insulated gate bipolar transistor IGBT1, the former is advantageously excellent in controllability in switching. If MOS transistor FET1 turned on has a large current passing therethrough, there is a possibility that it may provide a larger switching loss than insulated gate bipolar transistor IGBT1 does. In reality, however, MOS transistor FET2 only passes a small current. As such, its switching loss is substantially negligible.

Second Embodiment in Exemplary Variation

Figure 6:
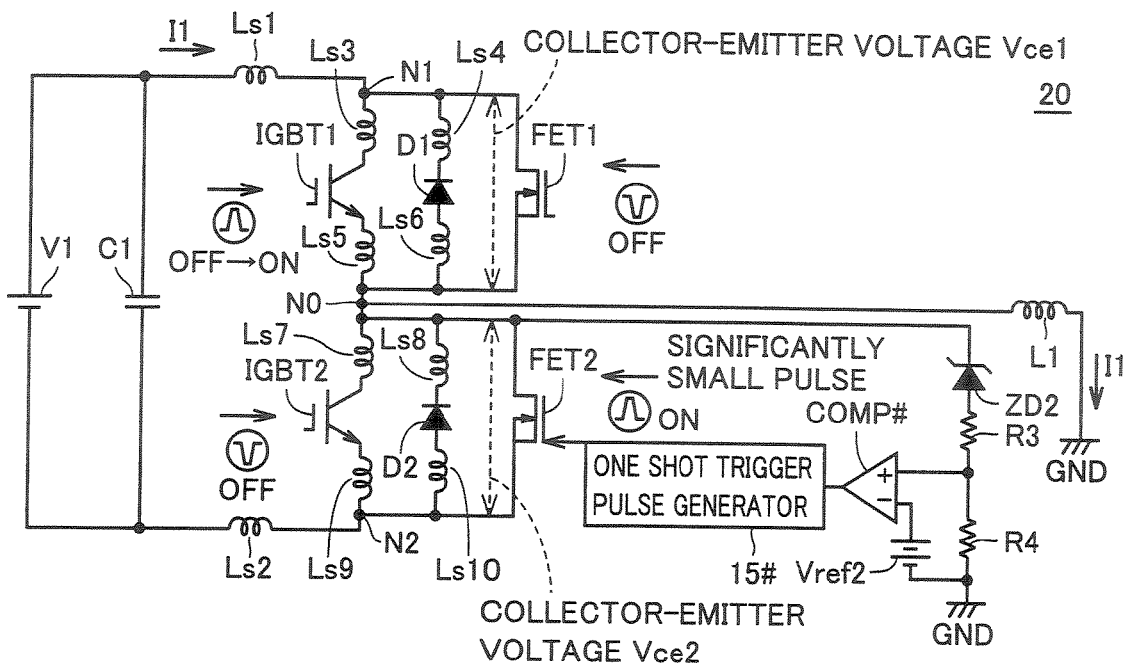
FIG. 6 shows a configuration of a circuit of an inverter device in an exemplary variation of the second embodiment of the present invention.

With reference to FIG. 6, the present invention in the second embodiment in an exemplary variation provides an inverter device 20, which differs from inverter device 1 in that the former further includes a signal generation circuit generating a significantly small pulse driving MOS transistor FET2.

More specifically, the former differs from the latter in that the former further includes a one shot trigger pulse generator 15# generating a significantly small pulse applied to MOS transistor FET2 at the gate, a comparator COMP#, a zener diode ZD2, and resistance elements R3 and R4.

Zener diode ZD2 has a cathode side electrically coupled with output node N0, and an anode side electrically coupled via resistance elements R3 and R4 with ground voltage GND.

Resistance elements R3 and R4 are connected in series between zener diode ZD2 and ground voltage GND by a node which is electrically coupled with comparator COMP# at one terminal. Comparator COMP# has the other terminal receiving a reference voltage Vref2, and compares a voltage generated at the node connecting resistance elements R3 and R4 with reference voltage Vref2 and outputs a result of such comparison to one shot trigger pulse generator 15#.

If one shot trigger pulse generator 15# receives the result e.g., a signal having the high level, from comparator COMP#, it outputs a one shot pulse signal (a significantly small pulse) to MOS transistor FET2.

The above operation will now be more specifically described.

When insulated gate bipolar transistor IGBT1 turned off starts to transition to turn on, voltage Vce2 of diode D2 or insulated gate bipolar transistor IGBT2 between the collector and emitter starts to vary, and depending on dI/dt of a recovery current, a surge voltage is caused. This surge voltage will exceed the zener voltage of zener diode ZD2 and resistance elements R3 and R4 will receive voltage, and a voltage divided by resistance elements R3 and R4 in accordance with their values in resistance is generated at the node connecting the resistance elements. Comparator COMP# compares the voltage thus generated at the node with reference voltage Vref2, and if a voltage of equal to or larger than reference voltage Vref2 is generated at the node, comparator COMP# outputs a result of such comparison indicating the high level to one shot trigger pulse generator 15#.

One shot trigger pulse generator 15# receives from comparator COMP# a signal of the result of such comparison (indicating the "high" level) and outputs a significantly small pulse (having a high level for a period of 0.04 to 0.6 μsec) only once. The pulse is applied to MOS transistor FET2 to temporarily turn on MOS transistor FET2 during the on period of insulated gate bipolar transistor IGBT1 to allow a portion of the recovery current to be bypassed to MOS transistor FET2. This operation can alleviate or prevent a surge voltage, as described in the second embodiment.

Note that the significantly small pulse can have a width (or a period of the high level), which is set within the on period of insulated gate bipolar transistor IGBT1 and can be set within an optimal range in accordance with a characteristic of the inverter device. For example, insulated gate bipolar transistor IGBT1 has the on period set to be approximately 0.2 μsec to 3 μsec.

Generally, surge voltage's tolerance value is set within a rated withstand voltage of a device of interest. Accordingly, setting the zener voltage of zener diode ZD2 to be equal to or larger than the rated withstand voltage of the element of insulated gate bipolar transistor IGBT2 or zener diode ZD2 can alleviate or prevent only a surge voltage caused when a large load is involved and a large current is interrupted, so that MOS transistor FET2 can be set to be inoperative when a small load is involved and a small current is interrupted, and a large surge voltage is not caused. This can prevent MOS transistor FET2 from unnecessarily operating and accordingly generating heat, and unnecessarily switching and thus providing an increased loss.

Note that while the above has described a system alleviating or preventing a recovery surge voltage, i.e., a surge voltage caused when insulated gate bipolar transistor IGBT1 turned off transitions to turn on, it also applies to insulated gate bipolar transistor IGBT2 operating to switch with load L1 connected to power supply V1. A similar system can be applied to also alleviate or prevent a surge voltage caused when insulated gate bipolar transistor IGBT2 turned off transitions to turn on.

While the present embodiment has been described by referring as one example to an inverter circuit employing a half bridge circuit, it is also applicable to that employing a full bridge circuit, and similarly applicable to an intelligent power module (IPM), a semiconductor device having an IGBT serving as a switching element.

Furthermore the first and second embodiments and their exemplary variations can of course be combined together as appropriate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a half bridge circuit including,
   a first semiconductor switching element disposed between a first voltage and an output node, the first semiconductor switching element being driven in response to a first control signal received; and
   a second semiconductor switching element connected between said output node and a second voltage lower than said first voltage, and to said first switching element in series, the second semiconductor switching element being driven in response to a second control signal received; and
   a first MOS transistor, associated with said first semiconductor switching element, connected in parallel to said first semiconductor switching element and receiving a third control signal to turn on/off, wherein
   said first MOS transistor is turned on in response to said third control signal for a period of time during which said first semiconductor switching element transitions from an on-state to an off-state in response to said first control signal, the semiconductor device further comprising a signal generation circuit that detects a predetermined surge voltage caused while said first semiconductor switching element switches from the on-state to the off-state in response to said first control signal, and outputs said third control signal to control said first MOS transistor, said signal generation circuit including,
   a comparator that compares a voltage generated based on said first and second voltages together with a reference voltage, and provides a result of said comparing; and
   a one-shot trigger pulse signal generation circuit driven by said result to generate a one-shot trigger pulse signal serving as said third control signal.

2. The semiconductor device according to claim 1, wherein said signal generation circuit further includes:
   first and second resistance elements connected between said first and second voltages in series;
   a constant voltage diode disposed between said first and second resistance elements and said first voltage, and having a cathode side connected to said first voltage and an anode side connected to said first and second resistance elements; and
   the comparator compares the voltage generated at a node connecting said first and second resistance elements together with the reference voltage to provide said result of said comparing.

3. A semiconductor device comprising:
   a half bridge circuit including,
   a first semiconductor switching element disposed between a first voltage and an output node, the first semiconductor switching element being driven in response to a first control signal received; and
   a second semiconductor switching element connected between said output node and a second voltage lower than said first voltage, and to said first switching element in series, the second semiconductor switching element being driven in response to a second control signal received; and a first MOS transistor, associated with said second semiconductor switching element, connected in parallel to said first semiconductor switching element and receiving a third control signal to turn on/off, wherein said first MOS transistor is turned on in response to said third control signal for a period of time during which said first semiconductor switching element transitions from an off-state to an on-state in response to said first control signal, the semiconductor device further comprising a signal generation circuit that detects a predetermined surge voltage caused while said first semiconductor switching element switches from the off-state to the on-state in response to said first control signal, and outputs said third control signal to control said first MOS transistor, said signal generation circuit including, a comparator comparing a voltage generated at a node connecting said first and second resistance elements together with a reference voltage, and providing a result of said comparing; and a one-shot trigger pulse signal generation circuit driven by said result to generate a one-shot trigger pulse signal serving as said third control signal.

4. The semiconductor device according to claim 3, wherein said signal generation circuit further includes:

first and second resistance elements connected between said output node and said second voltage in series;

a constant voltage diode disposed between said first and second resistance elements and said output node, and having a cathode side connected to said output node and an anode side connected to said first and second resistance elements; and the comparator compares the voltage generated at a node connecting said first and second resistance elements together with the reference voltage to provide said result of said comparing.

* * * * *